(12) United States Patent
Kappes

(10) Patent No.: US 9,007,243 B2
(45) Date of Patent: Apr. 14, 2015

(54) SYSTEM AND METHOD FOR CUSTOMIZING DATA CONVERTERS FROM UNIVERSAL FUNCTION DICE

(71) Applicant: IQ-Analog Corporation, San Diego, CA (US)

(72) Inventor: Michael Kappes, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 14/537,587

(22) Filed: Nov. 10, 2014

(65) Prior Publication Data

US 2015/0061905 A1    Mar. 5, 2015

Related U.S. Application Data

(63) Continuation-in-part of application No. 14/531,371, filed on Nov. 3, 2014, which is a continuation-in-part of application No. 14/511,206, filed on Oct. 10, 2014, now Pat. No. 8,917,125, which is a (Continued)

(51) Int. Cl.
*H03M 1/00* (2006.01)
*H03M 1/10* (2006.01)
*H03M 1/12* (2006.01)
*H03M 1/66* (2006.01)

(52) U.S. Cl.
CPC ............ *H03M 1/005* (2013.01); *H03M 1/1071* (2013.01); *H03M 1/12* (2013.01); *H03M 1/66* (2013.01)

(58) Field of Classification Search
CPC .... H03M 1/004–1/008; H03M 1/0634–1/0638
See application file for complete search history.

(56) References Cited

U.S. PATENT DOCUMENTS

| | | | | | |
|---|---|---|---|---|---|
| 5,107,146 | A | * | 4/1992 | El-Ayat | 326/41 |
| 6,144,327 | A | * | 11/2000 | Distinti et al. | 341/126 |
| 6,150,837 | A | * | 11/2000 | Beal et al. | 326/39 |
| 6,686,860 | B2 | * | 2/2004 | Gulati et al. | 341/155 |
| 7,225,165 | B1 | * | 5/2007 | Kyojima et al. | 705/59 |
| 7,423,451 | B2 | | 9/2008 | Balasubramanian et al. | |
| 8,335,484 | B1 | | 12/2012 | Arad | |

(Continued)

OTHER PUBLICATIONS

Reeder et al. "Pushing the State of the Art with Multichannel A/D Converters", Analog Devices Inc. Analog Dialogue 39-05, May 2005.*

(Continued)

*Primary Examiner* — Howard Williams
(74) *Attorney, Agent, or Firm* — Law Office of Gerald Maliszewski; Gerald Maliszewski

(57) ABSTRACT

A method is provided for supplying a customized data converter fabricated from a universal function die. The method initially fabricates a plurality of universal data converter dice. Each universal data converter die is capable of performing a first plurality of data conversion algorithms. After the dice are made, each universal data converter die is tested to verify the performance of the first plurality of data conversion algorithms. Subsequently, a request is received for a customized data converter capable of performing a first data conversion function, which is selected from among the first plurality of data conversion algorithms. The method then fabricates a customized data converter capable of performing the first data conversion function, using a tested universal data converter die. The unselected data converter functions are disabled (not enabled). A configuration interface may be used to enable the requested data conversion function.

36 Claims, 8 Drawing Sheets

Related U.S. Application Data continuation-in-part of application No. 14/081,568, filed on Nov. 15, 2013, now Pat. No. 8,878,577, which is a continuation-in-part of application No. 13/603,495, filed on Sep. 5, 2012, now Pat. No. 8,654,000, application No. 14/537,587, which is a continuation-in-part of application No. 14/158,299, filed on Jan. 17, 2014, and a continuation-in-part of application No. 14/489,582, filed on Sep. 18, 2014, now Pat. No. 8,928,513.

(56) References Cited

U.S. PATENT DOCUMENTS

| | | |
|---|---|---|
| 8,358,231 B2 | 1/2013 | Killat |
| 8,368,571 B2 | 2/2013 | Siragusa |
| 8,462,030 B2 | 6/2013 | Muhammad |
| 8,471,751 B2 | 6/2013 | Wang |
| 8,519,876 B2 | 8/2013 | Lin |
| 8,519,878 B2 | 8/2013 | Jensen |
| 8,542,140 B2 | 9/2013 | Chen |
| 8,542,142 B2 | 9/2013 | Stein |
| 8,542,144 B2 | 9/2013 | Coban |
| 8,548,071 B2 | 10/2013 | Collins |
| 8,711,026 B1 | 4/2014 | Kappes |
| 2010/0283649 A1 | 11/2010 | Bos |

OTHER PUBLICATIONS

Erdmann et al., A heterogeneous 3D-IC Consisting of Two 28nm FPGA Die and 32 Reconfigurable High-Performance Data Converters, 2014 IEEE Int solid-state circuits conf.

* cited by examiner

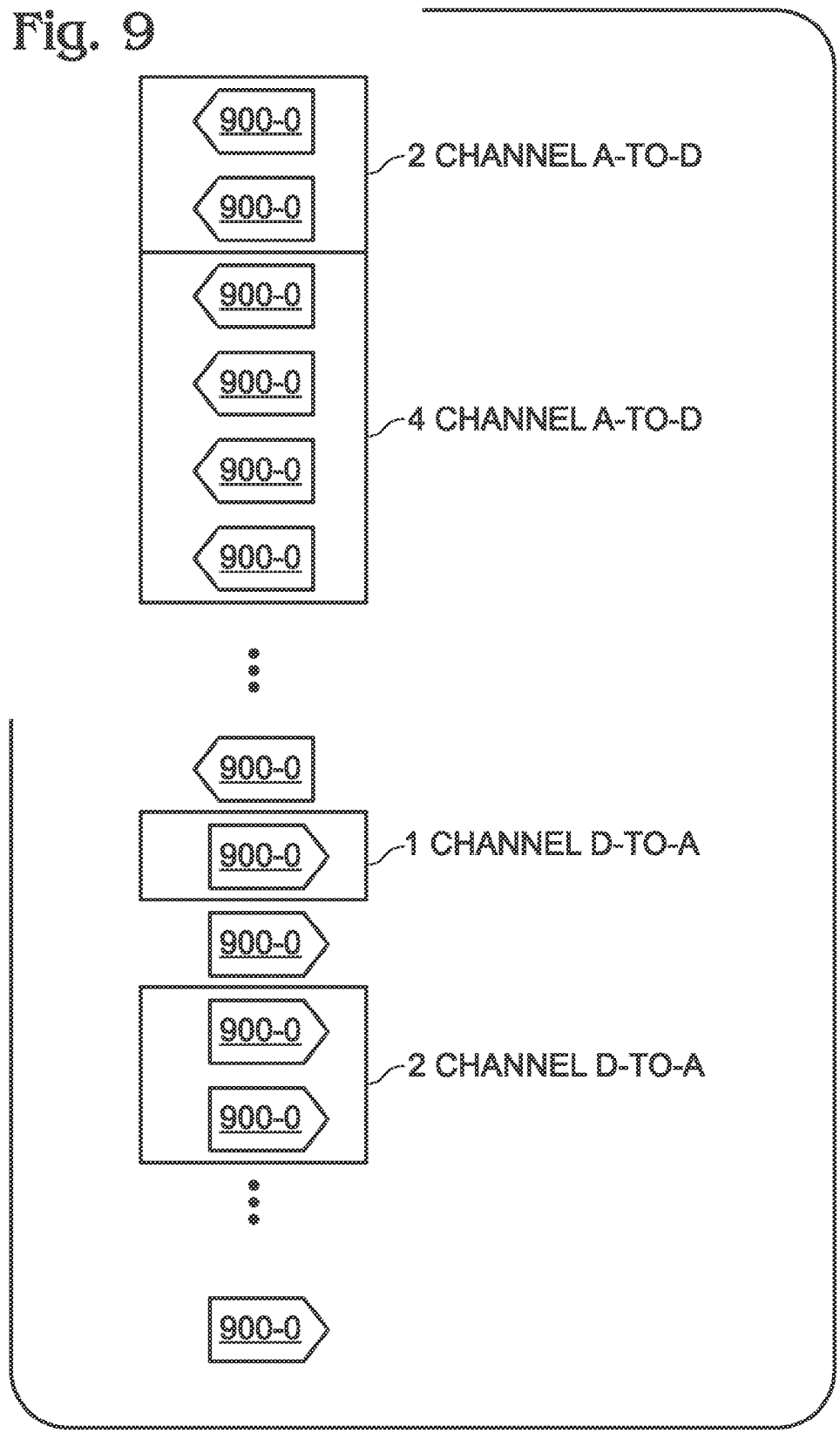

SYSTEM AND METHOD FOR CUSTOMIZING DATA CONVERTERS FROM UNIVERSAL FUNCTION DICE

RELATED APPLICATIONS

The application is a Continuation-in-part of an application entitled, CURRENT STEERING DIGITAL-TO-ANALOG CONVERTER (DAC) SWITCH DRIVER, invented by Mikko Waltari, Ser. No. 14/489,582, filed Sep. 18, 2014.

The application is a Continuation-in-part of an application entitled, MULTIPLYING DIGITAL-TO-ANALOG CONVERTER, invented by Waltari et al., Ser. No. 14/158,299, filed Jan. 17, 2014.

This application is a Continuation-in-part of an application entitled, N-PATH INTERLEAVING ANALOG-TO-DIGITAL CONVERTER (ADC) WITH BACKGROUND CALIBRATION, invented by Mikko Waltari et al., Ser. No. 14/531,371, filed Nov. 3, 2014.

which is a Continuation-in-part of an application entitled, INTERLEAVING ANALOG-TO-DIGITAL CONVERTER (ADC) WITH BACKGROUND CALIBRATION, invented by Mikko Waltari et al., Ser. No. 14/511,206, filed Oct. 10, 2014;

which is a Continuation-in-part of an application entitled, SYSTEM AND METHOD FOR FREQUENCY MULTIPLIER JITTER CORRECTION, invented by Mikko Waltari et al., Ser. No. 14/081,568, filed Nov. 15, 2013;

which is a Continuation-in-Part of an application entitled, TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000 on Feb. 18, 2014. All these application are incorporated herein by reference.

BACKGROUND OF THE INVENTION

1. Field of the Invention

This invention generally relates to analog-to digital and digital-to-analog data conversion and, more particularly, to a system and method for customizing a universal data conversion device, capable of potentially performing many different types of functions.

2. Description of the Related Art

As noted in Wikipedia, an ADC is a device that converts a continuous physical quantity, such as voltage, to a digital number that represents the analog quantity's amplitude. The conversion involves quantization of the input, so it necessarily introduces a small amount of error. Instead of doing a single conversion, an ADC often performs the conversions by sampling the input periodically. The result is a sequence of digital values that have converted a continuous-time and continuous-amplitude analog signal to a discrete-time and discrete-amplitude digital signal.

An ADC is often characterized by its input bandwidth, the range of input signal frequencies it can measure, and its signal-to-noise ratio (SNR). SNR is the accuracy with which a signal can be measured with respect to the noise it introduces. The SNR of an ADC is influenced by many factors, including the resolution, which is the number of output levels to which it can quantize a signal. Linearity and accuracy, or how well the quantization levels match the true analog signal, and aperture jitter, small timing errors that introduce additional errors, also influence the SNR. The SNR of an ADC is often summarized in terms of its effective number of bits (ENOB), the number of bits of each measure it returns that are on average not noise. ADCs are chosen to match the bandwidth and required SNR of the signal to be quantized.

Conventionally, if an ADC operates at a sampling rate greater than twice the bandwidth of the signal, then perfect reconstruction is possible given an ideal ADC and neglecting quantization error. The presence of quantization error limits the SNR of even an ideal ADC. However, if the SNR of the ADC exceeds that of the input signal, its effects may be neglected resulting in an essentially perfect digital representation of the input signal.

The resolution of the converter indicates the number of discrete values it can produce over the range of analog values. The resolution determines the magnitude of the quantization error and therefore determines the maximum possible average SNR for an ideal ADC without the use of oversampling. The values are usually stored electronically in binary form, so the resolution is usually expressed in bits. In consequence, the number of discrete values available, or "levels", is assumed to be a power of two. For example, an ADC with a resolution of 8 bits can encode an analog input to one in 256 different analog levels, since $2^8=256$. Resolution can also be defined electrically, and expressed in volts. The minimum change in voltage required to guarantee a change in the output code level digital signal is called the least significant bit (LSB) voltage.

The analog signal is continuous in time and it is necessary to convert this to a flow of digital values. Therefore, a rate must be determined at which new digital values are sampled from the analog signal. The rate of new values is called the sampling rate or sampling frequency of the converter. A continuously varying bandlimited signal can be sampled as the signal values at intervals of time T, the sampling time, are measured and stored. Then, the original signal can be exactly reproduced from the discrete-time values by an interpolation formula. The accuracy is limited by quantization error. However, this faithful reproduction is typically only possible if the sampling rate is higher than twice the highest frequency of the signal. This is essentially what is embodied in the Shannon-Nyquist sampling theorem.

An ADC works by sampling the value of the input at discrete intervals in time. Provided that the input is sampled above the Nyquist rate, defined as twice the highest frequency of interest, then all frequencies in the signal can be reconstructed. If frequencies above half the Nyquist rate are sampled, they are incorrectly detected as lower frequencies, a process referred to as aliasing. Aliasing occurs because instantaneously sampling a function at two or fewer times per cycle results in missed cycles, incorrectly giving the appearance of a lower frequency. To avoid aliasing, the input to an ADC may be low-pass filtered to remove frequencies above half the sampling rate. This filter is called an anti-aliasing filter.

Although aliasing in most systems is unwanted, in some aspects it may be exploited to provide simultaneous downmixing of a band-limited high frequency signal. The alias is effectively the lower heterodyne of the signal frequency and sampling frequency.

Signals are often sampled at the minimum rate required, for economy, with the result that the quantization noise introduced is white noise spread over the whole pass band of the converter. If a signal is sampled at a rate much higher than the Nyquist frequency, and then digitally filtered to limit it to the signal bandwidth, there are many advantages. A digital filter can have better properties, such as a sharper rolloff, than an analog filter, so a sharper anti-aliasing filter can be realized. Subsequent to filtering, the signal can be downsampled. This technique creates an effectively larger resolution than can be provided by an ADC device acting alone.

These are many ways of implementing an electronic ADC. A direct-conversion ADC or flash ADC has a bank of comparators sampling the input signal in parallel, each firing for their decoded voltage range. The comparator bank feeds a logic circuit that generates a code for each voltage range. Direct conversion is very fast, capable of gigahertz sampling rates, but usually has only 8 bits of resolution or fewer, since the number of comparators needed, $2^N-1$, doubles with each additional bit, requiring a large, expensive circuit. ADCs of this type typically have a large die size, a high input capacitance, high power dissipation, and are prone to produce glitches at the output (by outputting an out-of-sequence code). U.S. Pat. No. 8,519,876, invented by Zhi-Ming Lin, filed on Mar. 27, 2012, is incorporated herein by reference, and provides an example of a flash ADC.

A successive-approximation ADC uses a comparator to successively narrow a range that contains the input voltage. At each successive step, the converter compares the input voltage to the output of an internal digital to analog converter which might represent the midpoint of a selected voltage range. At each step in this process, the approximation is stored in a successive approximation register (SAR). U.S. Pat. No. 8,542,144, invented by A. Coban, filed on Sep. 30, 2011, is incorporated herein by reference, and provides an example of a successive-approximation ADC.

A ramp-compare ADC produces a saw-tooth signal that ramps up or down then quickly returns to zero. When the ramp starts, a timer starts counting. When the ramp voltage matches the input, a comparator fires, and the timer's value is recorded. Timed ramp converters require the least number of transistors. The ramp time is sensitive to temperature because it is dependent upon the circuit generating the ramp.

The Wilkinson ADC is based on the comparison of an input voltage with that produced by a charging capacitor. The capacitor is allowed to charge until its voltage is equal to the amplitude of the input pulse. A comparator determines when this condition has been reached. Then, the capacitor is allowed to discharge linearly, which produces a ramp voltage. At the point when the capacitor begins to discharge, a gate pulse is initiated. The gate pulse remains on until the capacitor is completely discharged. Thus, the duration of the gate pulse is directly proportional to the amplitude of the input pulse. This gate pulse operates a linear gate which receives pulses from a high-frequency oscillator clock. While the gate is open, a discrete number of clock pulses pass through the linear gate and are counted by the address register. The time the linear gate is open is proportional to the amplitude of the input pulse, thus the number of clock pulses recorded in the address register is proportional to the amplitude. Alternatively, the charging of the capacitor can be monitored, rather than the discharge.

An integrating ADC, also known as a dual-slope or multi-slope ADC, applies an unknown input voltage to the input of an integrator and allows the voltage to ramp for a fixed time period (the run-up period). Then a known reference voltage of opposite polarity is applied to the integrator, and is allowed to ramp until the integrator output returns to zero (the run-down period). The input voltage is computed as a function of the reference voltage, the constant run-up time period, and the measured run-down time period. The run-down time measurement is usually made in units of the converter's clock, so longer integration times allow for higher resolutions. The speed of the converter can be improved by sacrificing resolution.

A delta-encoded (tracking) ADC or counter-ramp has an up-down counter that feeds a digital-to-analog converter (DAC). The input signal and the DAC both go to a comparator. The comparator controls the counter. The circuit uses negative feedback from the comparator to adjust the counter until the DAC's output is close enough to the input signal. The number is read from the counter. Delta converters have very wide ranges and high resolution, but the conversion time is dependent on the input signal level. Some converters combine the delta and successive approximation approaches; this works especially well when high frequencies are small in magnitude. U.S. Pat. No. 8,358,231, invented by Killat et al., with a priority date of Feb. 21, 2011, which is incorporated herein by reference, provides an example of a delta-encoded ADC.

As noted in U.S. Pat. No. 8,368,571, invented by Eric Siragusa, filed on Mar. 31, 2011, and incorporated herein by reference, a pipelined ADC 20 converts the overall analog input AIN delivered to the first stage 24 by successively approximating in turn the analog input AI at each stage 24, to the predetermined bit width of that stage 24, then generating and amplifying the analog residue AR representing the unconverted remainder of the analog input AI at that stage 24, and passing the amplified residue MR to the next stage 24 and repeating the process. Ultimately, the ADC 20 can convert the original analog input AIN by combining the digital output DO produced by each of the individual stages 24, which can be performed by a delay and combine circuit 44, to successively build corresponding digitized residues DR into the overall digital output DOUT. Other architectures are known in the art that can be configured to improve resolution.

An oversampling ADC, oversamples an analog input signal by a large factor and filters the desired signal band. In a sigma-delta version of this ADC, the resulting signal, along with the error generated by the discrete levels of a flash ADC, is fed back and subtracted from the input to the aliasing filter. This negative feedback has the effect of noise shaping the error due to the flash, so that it does not appear in the desired signal frequencies. A digital filter (decimation filter) follows the ADC that reduces the sampling rate, filters off unwanted noise, and increases the resolution of the output. The use of "noise-shaping" through analog feedback mechanisms is not required to benefit from oversampling, but noise shaping makes oversampling more efficient (more resolution with less oversampling). However, this process requires approximately greater than 16× oversampling to be effective, as well as analog filter and feedback mechanisms. Simple decimation filtering of a flat (white) noise data converter yields an effective 3 dB SNR for every octave of oversampling. US 2010/0283649, invented by Bos et al., with a priority date of May 7, 2010, is incorporated herein by reference, and provides an example of a sigma-delta ADC.

A time-interleaved ADC uses M parallel ADCs where each ADC samples data every M:th cycle of the effective sample clock. The result is that the sample rate is increased M times compared to what each individual ADC can manage. Technologies exist to correct time-interleaving mismatch errors. An ADC with an intermediate frequency modulation (FM) stage first uses a voltage-to-frequency converter to convert the desired signal into an oscillating signal with a frequency proportional to the voltage of the desired signal, and then uses a frequency counter to convert that frequency into a digital count proportional to the desired signal voltage. U.S. Pat. No. 8,542,142, invented by Stein et al., filed on Feb. 21, 2013, is incorporated herein by reference, and provides an example of an interleaved ADC.

A time-stretch analog-to-digital converter (TS-ADC) digitizes a very wide bandwidth analog signal, which cannot be digitized by a conventional electronic ADC, by time-stretching the signal prior to digitization. This technique effectively slows the signal down in time and compresses its bandwidth. As a result, an electronic backend ADC that would have been too slow to capture the original signal, can now capture this slowed down signal.

Other types of ADCs, and variations of the above-mentioned ADC type include the following. U.S. Pat. No. 8,542,140, invented by Chen et al., filed on Jan. 12, 2012, is incorporated herein by reference, and provides an example of an exponential-logarithmic ADC. U.S. Pat. No. 8,471,751, invented by Zhenning Wang, filed on Jun. 30, 2011, is incorporated herein by reference, and provides an example of a time-to-digital converter (TDC).

A digital-to-analog converter (DAC) converts a digital signal, typically represented by a series of binary logic symbols, into an analog current or voltage. In a pulse-width modulator DAC type, a current or voltage is switched into a low-pass analog filter with a duration determined by the digital input code. Oversampling or interpolating DACs, such as the delta-sigma DAC, use a pulse density conversion technique. The DAC is driven with a pulse-density modulated signal, created with the use of a low-pass filter, step nonlinearity (the actual 1-bit DAC), and negative feedback loop, in a technique called delta-sigma modulation. This results in an effective high-pass filter acting on the quantization (signal processing) noise, thus steering this noise out of the low frequencies of interest into the megahertz frequencies of little interest, which is called noise shaping.

The binary-weighted DAC contains individual electrical components for each bit of the DAC connected to a summing point. These precise voltages or currents sum to the correct output value. A switched resistor DAC contains of a parallel resistor network. Individual resistors are enabled or bypassed in the network based on the digital input. A switched current source or current steering DAC uses different current sources selected by the digital input. A switched capacitor DAC contains a parallel capacitor network. Individual capacitors are connected or disconnected with switches based on the input.

A R-2R ladder DAC is a binary-weighted DAC that uses a repeating cascaded structure of resistor values R and 2R. A successive-approximation or cyclic DAC successively constructs the output during each cycle. Individual bits of the digital input are processed each cycle until the entire input is accounted for.

The thermometer-coded DAC contains an equal resistor or current-source segment for each possible value of DAC output. An 8-bit thermometer DAC would have 255 segments, and a 16-bit thermometer DAC would have 65,535 segments. To minimize the number of components, the DAC may use banks of segments, where a digital value is represented by a combination segment values. This segmented DAC combines the thermometer-coded principle for the most significant bits and the binary-weighted principle for the least significant bits. In this way, a compromise is obtained between precision (by the use of the thermometer-coded principle) and number of resistors or current sources (by the use of the binary-weighted principle).

Conventionally, in designing a product, the manufacturer of an electrical system determines the performance required by an ADC or DAC, specifying characteristics such the data rate, dynamic range, digital output signal resolution, and SNR. Upon determining the circuit performance required, the circuit is designed from discrete components, or an integrated circuit (IC) is purchased from a vendor. In the case of the IC, the printed circuit board (PCB) upon which the circuit is mounted must be designed to conform to a pre-existing IC pin out, or a custom IC designed with a pin out that conforms to the PCB.

An advancement in the manufacturing process is described in U.S. Pat. No. 8,548,071, where the IC design process begins by selecting a predetermined number of ADCs (or DACs), and assigning the ADCs to input/output ports based upon the desired data rate. Configuration data is generated for programmable interconnects between the ports and ADCs, which is then loaded into the IC (FIGS. 3, 18, and 19). Advantageously, data rate, power, and resolution design requirements can be addressed by selecting the number of parallel channels or by the use of an interleaving technique (FIGS. 4-8). In some aspect, the routing to different ADC circuits can be made to periodically change based upon clock speed (FIG. 11). While this process may simplify the design of an IC, the problem remains that once the IC is designed, its use is still limited to a particular customer and a particular implementation. This problem necessarily impacts overall product performance and options, as well as ADC component lead times and costs.

It would be advantageous if it were possible to design a data converter IC, fabricated initially to potentially perform a wide variety of data converter functions, which could be simply modified during fabrication or in the field to perform the particular function desired by the user.

SUMMARY OF THE INVENTION

Accordingly, a method is provided for supplying a customized data converter, fabricated from a universal function die or integrated circuit (IC). The method initially fabricates a plurality of universal data converter dice. Each universal data converter die is capable of performing a first plurality of data conversion algorithms, which might be analog-to-digital (A-to-D), digital-to-analog (D-to-A), or both A-to-D and D-to-A algorithms. For example, the A-to-D algorithms may include averaging, oversampling, multi-stage pipelining, and interleaving, and combinations of the above-mentioned algorithms, as implemented by any of the ADC circuits types mentioned in the Background Section, above. Likewise, the D-to-A functions may be implemented using the above-mentioned DAC circuits.

After the dice are made, each universal data converter die is tested to verify the performance of the first plurality of data conversion algorithms. Subsequently, a request is received for a customized data converter capable of performing a first data conversion function, which is selected from among the first plurality of data conversion algorithms. The method then fabricates a customized data converter capable of performing the first data conversion function, using a tested universal data converter die. The unselected data converter functions are disabled (not enabled). In one aspect, the request may be for a customized data converter capable of performing a second plurality of data converter functions (i.e. more than one data converter function), less than or equal to the first plurality. In this case, the customized data converter may be fabricated with a configuration interface to accept signals from external sources, for selecting one or more data conversion functions from among the second plurality of data conversion functions.

In another aspect, a request is made for a customized data converter capable of performing a first data converter function with a plurality of selectable options. Then, the customized data converter is fabricated with a configuration interface to accept signals from external sources, selecting the first data converter function options. For example, an A-to-D averaging algorithm uses a plurality of analog-to-digital converters (ADCs). Each ADC has an analog input to accept an analog input signal and a digital output to supply a digital output signal with a first signal-to-noise ratio (SNR) in response to sampling the analog input signal. An averager has a plurality of inputs, where each input is connected to a corresponding ADC digital output. The averager has an output to supply an averaged digital output signal with a second SNR, greater than the first SNR. In this case, the configuration interface may accept signals from external sources, for selecting the number of ADCs being sampled.

In one aspect, the universal data converter dice are fabricated with a processor and a non-transitory local memory, and the requested data converter function may rely upon using a data converter software application that is embedded in the local memory when the customized data converter is fabricated. In a related aspect, if a plurality of data converter functions are requested that are used in conjunction with a corresponding plurality of data converter software applications, then the customized data converter is fabricated with a configuration interface capable of loading a software application into the local memory, modifying a software application in the local memory, or a combination of the above-mentioned tasks.

Additional details of the above-described method and a customizable data converter are provided below.

BRIEF DESCRIPTION OF THE DRAWINGS

FIG. 9 is a schematic block diagram depicting exemplary A-to-D and D-to-A selections.

DETAILED DESCRIPTION

Figure 1:
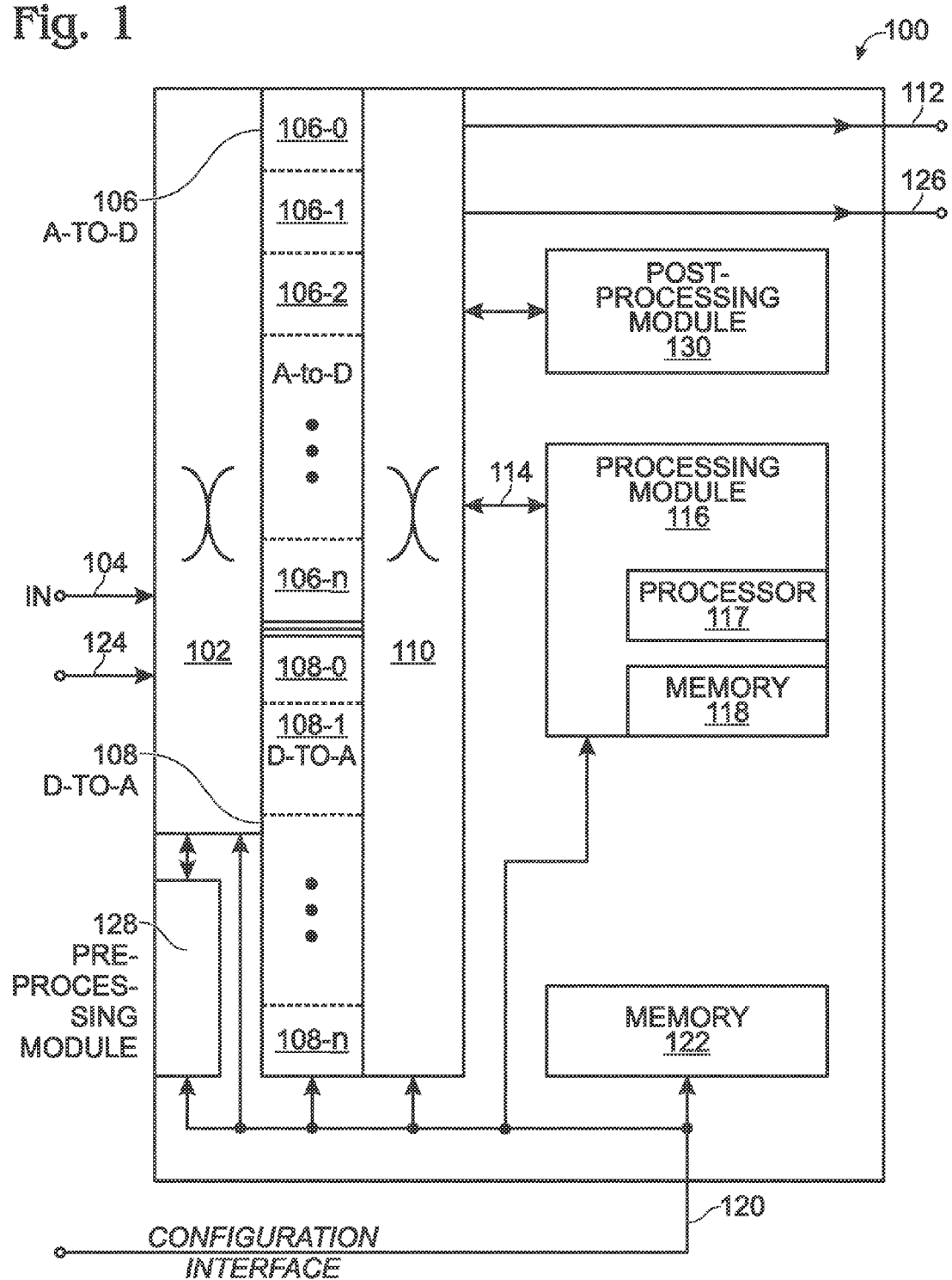
FIG. 1 is a schematic block diagram depicting a universal data converter system with customization capabilities.

FIG. 1 is a schematic block diagram depicting a universal data converter system with customization capabilities. The system 100 has an input interface 102 represented as a crossbar switch. The crossbar switch 102 is intended to represent potential connections between inputs on lines 104 and 124, the analog-to-digital (A-to-D) input section 106, and digital-to-analog (D-to-A) input section 108. Here, two input lines, 104 and 124, are shown, but it should be understood that the system is not limited to any particular number of inputs. As explained in more detail below, the system can support parallel or sequential data conversion operations. The data input signals on lines 104 and 124 may be either analog or digital in format.

The input interface 102 may be enabled with the use of fixed wire bonds between the input on lines 104 and 124, and section 106 and/or 108. Otherwise, the connections may be selectively enabled through the use of gates, transistors, switches, and multiplexers. In some aspects, the input interface is located off of the die, in which case system 100 may be termed an integrated circuit (IC), i.e., a die located on a chip carrier.

A-to-D section 106 comprises a plurality of A-to-D algorithms, represented as 106-0 through 106-$n$. Elements 106-0 through 106-$n$ are generally referred to as algorithms or functions since they represent circuitry capable of converting analog data to digital data using different types of processing (e.g., oversampling, interleaving, averaging, and pipelining). The term algorithm is used since the different elements may represent variations within a particular type of processing (e.g., low resolution and high resolution oversampling). Further, the term algorithm is intended to cover the use of different types of analog-to-digital converters (e.g., flash ADC and Wilkinson ADC), or even the use of the same type of ADC at different data rates.

A similar analysis applies to D-to-A section 108, which comprises a plurality of D-to-A algorithms, represented as 108-0 through 108-$n$. Again, elements 108-0 through 108-$n$ are generally referred to as algorithms or functions since they represent circuitry capable converting digital data to analog data using different types of processing, different variations within a particular type of processing, the use of different types of digital-to-analog converters (DACs), or even the use of the same type of DAC at different data rates. Some examples of D-to-A algorithms include averaging, oversampling, and mixing, where mixing is simply adding. D-to-A averaging is similar to mixing, but averaging assumes the same signal, while adding (mixing) can be two (or more) different DAC signals. The complementary function to A-to-D decimation (down-sampling) and filtering is D-to-A up-sampling and filtering (i.e. interpolation). This algorithm permits DAC images to be supplied at the full rate of the DAC sample rate, independent of the input data rate.

An output interface block 110 is connected to sections 106 and 108. The output interface block 110 is comprised of a set of gates, transistors, switches, multiplexers, and demultiplexers capable of intra-connecting components within A-to-D sections or D-to-A sections, or connecting the output of these sections to subsequent circuitry in the die. These intra-connections are explained in more detail below. In one aspect, the components of the output interface block 110 are fabricated as part of the process of making the die, and these components are configurable, as explained in more detail below. The output interface block 110 has an output on line 112 and an output on line 126, but it should be understood that the system is not limited to any particular number of output lines. In one aspect, it is possible that connections within the output interface block may be wire bonded. That is, the output interface block 110 may comprise a wire bond between the universal die and an interface (e.g., ball grid array (BGA)) on an IC chip carrier.

In another aspect, the output interface block 110 has a data bus connected on line 114 to processing module 116. The processor module 116 may be comprised of at least one processor 117, with a non-transitory memory 118. The memory 118 may include software applications comprised of a sequence of processor executable instructions to perform a task associated with data conversion. Some data conversion algorithms require processing as an intermediate step, so that data is passed back-and-forth between the processing module 116, and sections 106 and 108 via the output interface block 110. Alternatively, information may be digitally processed as the final step in data conversion, and may be passed from the processing module 116 to the output interface block for output on lines 112 or 126. In one aspect, the input interface 102 or output interface block 110 may carry clock signals to section 106 or 108 to enable data conversion. Alternatively, the clocks (not shown) are embedded in sections 106 and 108.

System 100 may also comprise a configuration interface on line 120. The configuration interface can be used to enter a codeword used to enable and disable selectable components in the input interface 102 and the output interface block 110. In simple aspects, the codeword may be an analog pull-up or pull-down voltage, or a plurality of parallel voltages. In another aspect, the codeword may be a digital word, which is used to selectively enable elements of interfaces 102 and 110. The codeword, whether in analog or digital form, may be stored in memory 122. Likewise, the codeword may be used to selectively enable various elements of A-to-D section 106 and D-to-A section 108. Some examples of enablement include supplying power, selectively connecting sub-elements, and controlling the delivery and speed of clock signals. In another aspect, the codeword may be considered to be a software application that is loaded, modified, or deleted from processor memory 118.

In one aspect, the processing module 116 analyzes the input data, either before or after it is converted by a data converter algorithm 106 or 108. In response to the analysis, the processing module changes the type of A-to-D data converter algorithm being used, e.g., from algorithm 106-0 to 106-1. In another aspect, the processing module 116 may modify the A-to-D algorithm already in use. For example, the A-to-D data converter algorithm may be changed from a 2-path A-to-D interleaving algorithm to a 4-path interleaver. The above-mentioned modifications may be made to increase or decrease resolution, increase or decrease the data conversion rate, or increase or decrease power usage, to name a few examples. Further, the processing module may modify the output interface block 110 to connect the selected A-to-D data converter algorithm to a different output pin (e.g., from line 112 to 128), or connect the selected A-to-D data converter to a different input pin (e.g., from the input on line 104 to an input on line 128).

In another aspect, the processing module 116 may use the input interface 102 to change the type of data conversion being performed. For example, in response to a change from analog to digital data being received on line 104, the processing module 116 may change from an A-to-D data converter algorithm 106-0 to a D-to-A data converter algorithm 108-0. Likewise, the processing module 116 may make modifications to the input interface 102 and output interface block 110 to change between the type of D-to-A data converter algorithm being used, or to make modifications to a D-to-A data converter algorithm already in use. In one aspect, the processing module 116 may enable some initial processing prior to data conversion using pre-processing module 128 in cooperation with the input interface 102. Some examples of pre-processing may include attenuation, amplification, or automatic gain control (AGC) of analog signals, as well as amplification, attenuation, and clock synchronization of digital signals.

In another aspect, input data on line 104 may comprise a sub-channel of information directing the processing module 116 to make the above-mentioned modifications. This sub-channel of information, since it only has application to system 100, is not necessarily converted in format and supplied as output data on lines 112 or 128. In one aspect, the sub-channel may be in a different format that the data. For example, the data may be in analog form and sub-channel may be in digital form. In this case, the input on line 104 may be multiplexed between an A-to-D data converter algorithm and a D-to-A data converter algorithm, or more likely, simultaneously supplied to both an A-to-D data converter algorithm and a D-to-A data converter algorithm. In another aspect, one data input line (e.g., line 104) may be used as a configuration interface directing the processing module 116 to operate in a particular manner, with respect to data to be converted that is input on another data input line (e.g., line 124).

Figure 2:
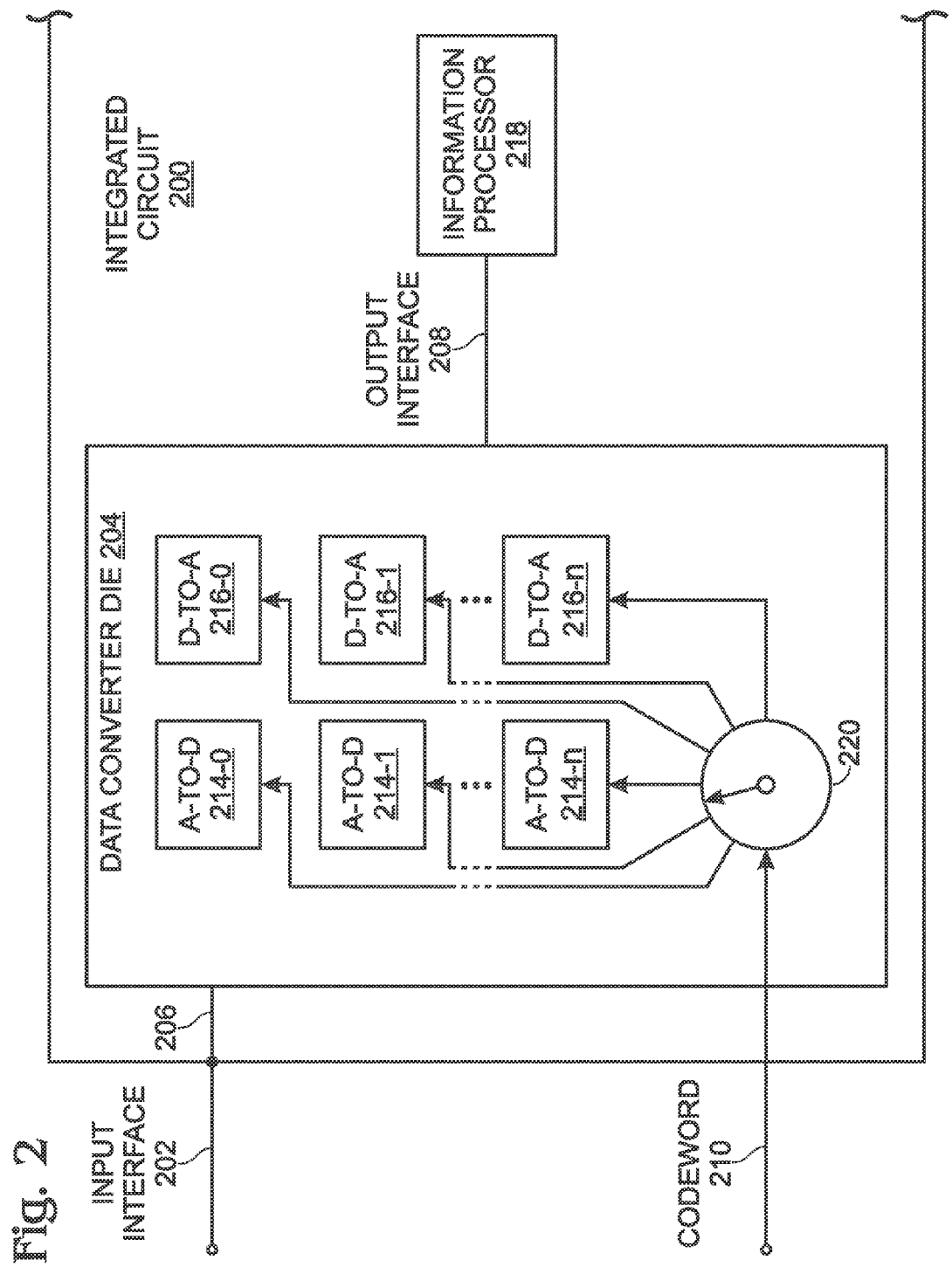
FIG. 2 is a schematic block diagram of a customizable data conversion integrated circuit (IC).

FIG. 2 is a schematic block diagram of a customizable data conversion integrated circuit (IC). The IC 200 comprises a circuit input interface on line 202 to receive data in an initial format, which may be analog or digital. A data converter die 204 comprises a data input on line 206 connected to the IC input interface on line 202. In some aspects not shown, lines 202 and 206 may be interfaced to each other via a wire bond connected, a switch, or a multiplexer. In other aspects, the signal on line 202 may be processed (e.g., amplified) prior to being delivered to line 206. The data converter IC 204 has a data output interface on line 208 to supply data in a converted format. For example, if the initial data format is analog, then the converted format may be digital, and if the initial formal is digital, the converted format may be analog. Typically, the data on line 208 is supplied to an information processing module 218, which may be located on the same IC, or elsewhere in a connected circuit. For example, the information processor 218 may be used to perform instructions in response to the received data.

The data converter die 204 has a configuration interface on line 210 to accept a codeword. A universal data converter die 204 is capable of performing a first plurality of data conversion algorithms in response to a corresponding first plurality of codewords. The algorithms may be A-to-D, D-to-A, or both A-to-D and D-to-A. Here, the various A-to-D algorithms are represented with reference designators 214-0 through 214-$n$, and the D-to-A algorithms are represented by reference designators 216-0 through 216-$n$. The selection of a particular algorithm, or a plurality of algorithms, is symbolically represented with commutator 220, which accepts a codeword on line 210. With respect to FIG. 1, the commutator would comprise elements of the input interface and output interface block. Typically, even if a plurality of algorithms is enabled, a plurality of algorithms is left disabled (not enabled).

Figure 3:
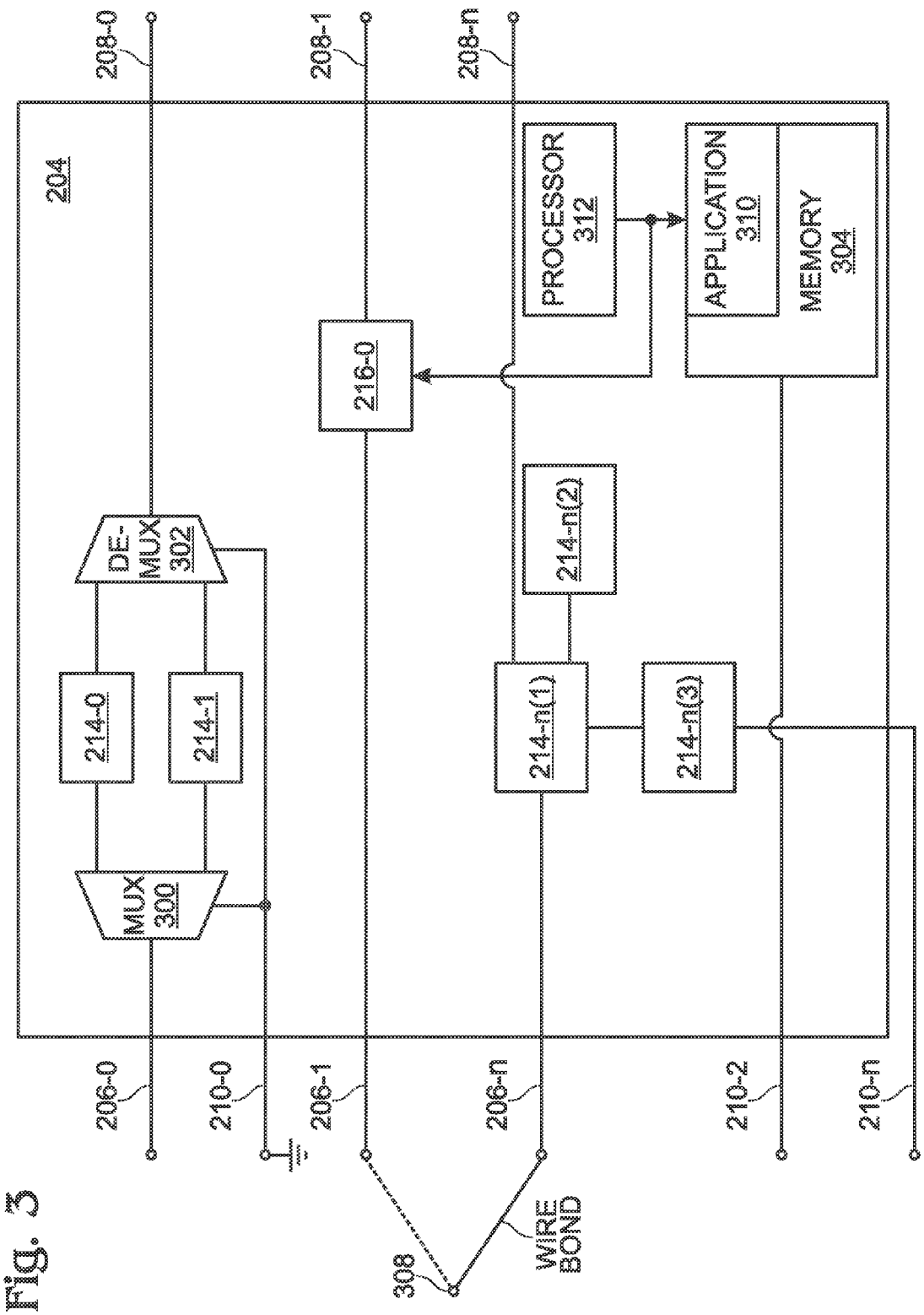
FIG. 3 is a schematic block depicting an exemplary version of the data converter system of FIG. 1.

FIG. 3 is a schematic block depicting an exemplary version of the data converter system of FIG. 1. As above, the data converter is fabricated and initially capable of performing a plurality of data converter algorithms, but is typically customized to perform a more limited number of algorithms. The data converter die 204 is not limited to any particular number of data inputs or data outputs. In one aspect, every A-to-D algorithm and every D-to-A algorithm has a fixed input and output. For example, algorithm 216-0 has a fixed input on line 206-0 and a fixed data output on line 208-1. However, a wire bond connection 306 may be used to selectively connect the line to node 308, which is external to the die. In one aspect, a wire bond connection internal to the die may determine if algorithm 216-0 or algorithm 214-$n$ is connected to an external node.

Alternatively, algorithms may share a selectable input and or data output. For example, algorithms 214-0 and 214-1 may share the data input on line 206-0 through the use of a multiplexer (MUX) 300, and share the data output on line 208-0 through the use of demultiplexer (DEMUX) 302. With respect to FIG. 1, the MUX 300 may be an element of the input interface and the DEMUX 302 an element of the output interface block. In one aspect, the codeword on line 210-0 controls the MUX 300 and DEMUX 302. Here, the codeword is shown as a connection to ground. Otherwise, the code word may be a plurality of parallel analog voltages or digital word stored in memory 304. The digital word may be encrypted in some aspects. In some aspects, the enablement of algorithms 214-0 and 214-1 may be the result of how the MUX and DEMUX are switched. Alternatively, the MUX and DEMUX control line is internal to the die, so that it is not accessible after fabrication of the die.

In another variation, if algorithm 216-0 is connected to node 308, as shown in phantom, the codeword on line 210-2 may be in the form of application 310, which is a sequence of processor executable software instructions stored in memory 304. For example, the application 310, in conjunction with processor 312, may perform data interpolation or estimation functions, that enable algorithm 216-0 to operate. Otherwise, the codeword on line 210-2 may operate to modify application 310, or as a key that permits the application 310 to operate. The key may or may not be encrypted.

In another variation, an algorithm may have a plurality of related options. For example, algorithm 214-$n$(1) may be a two-channel analog-to-digital converter (ADC), algorithm 214-$n$(2) may be a four-channel ADC, and algorithm 214-$n$(3) may be an eight-channel ADC. The selection of the option is responsive to a codeword on line 210-$n$.

Figure 4:
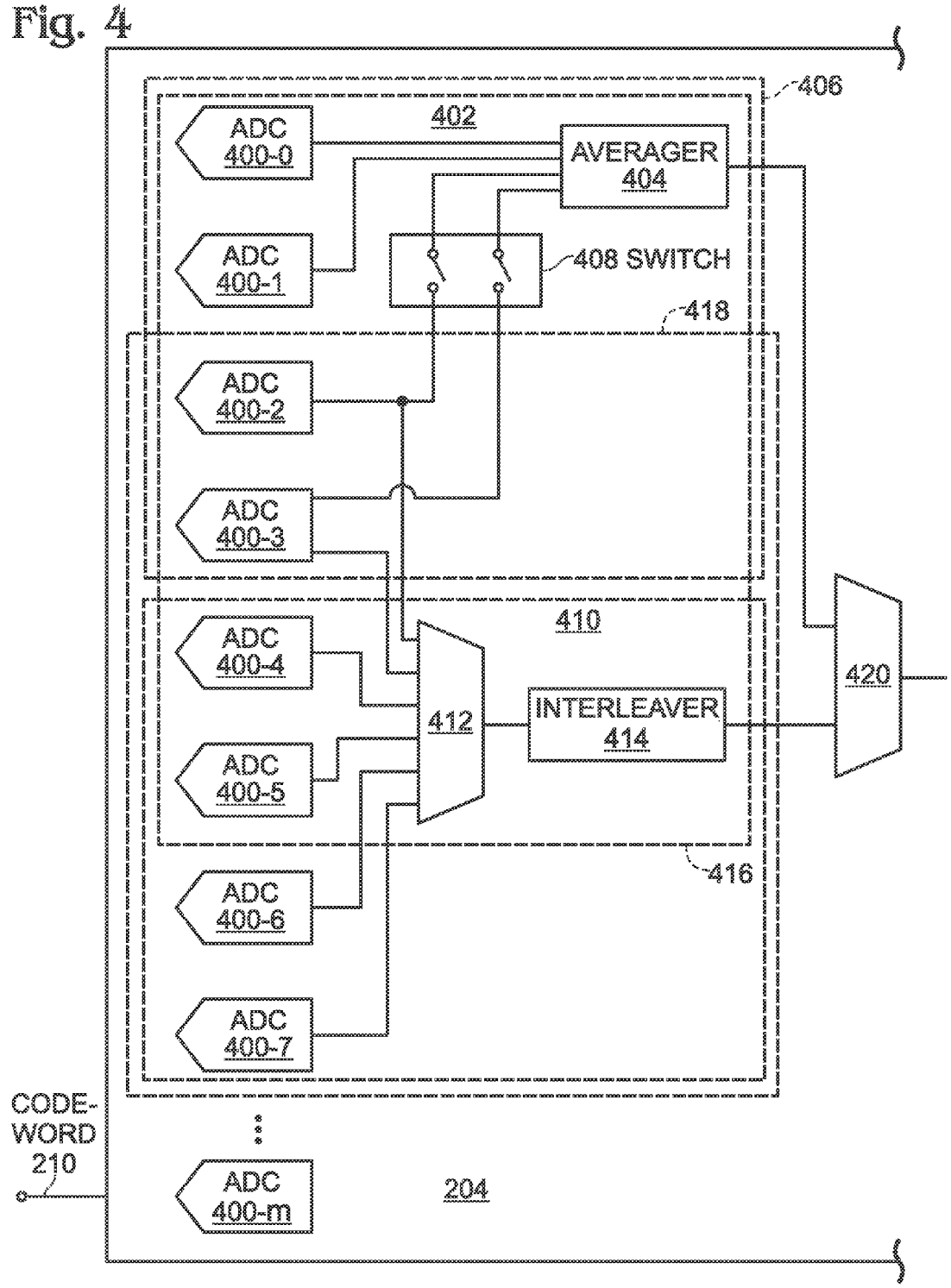
FIG. 4 is a schematic block diagram depicting some exemplary A-to-D algorithms in greater detail.

FIG. 4 is a schematic block diagram depicting some exemplary A-to-D algorithms in greater detail. Shown are ADCs 400-0 through 400-$m$. Each ADC is capable of multiple resolutions and sample data rates. Groups of ADCs may be dedicated to particular algorithms such as averaging, interleaving, oversampling/decimation, or pipelining. For example, group 402 comprises ADCs 400-0 and 400-1, as well as an averager 404 for a two-channel averaging algorithm. Group 406 comprises ADCs 400-1, 400-1, 400-2, 400-3, as well as averager 404. Thus, ADCs 400-0 and 400-1 are shared between two different averaging algorithms. The selection of the algorithm (group) used is responsive to switch 408, which may be controlled by a codeword on line 210. Alternatively but not shown, the four-channel averaging algorithm may use dedicated ADCs that are not shared.

Group 410 comprises ADCs 400-4, 400-5, MUX 412, and interleaver 414. Group 416 additionally includes ADCs 400-6 and 400-7, and group 418 additionally includes ADCs 400-2 and 400-3. Control over MUX 412 and, therefore, the selection the group, may be responsive to the codeword on line 210. Alternatively but not shown, ADCs making up groups 410, 416, and 418 may be dedicated (not shared). The selection of an interleaving group, as opposed to an averaging group, is controlled by MUX 420, which may be responsive to the codeword on line 210. As noted above, the codeword may be entered by a client in the field or set at the factory during fabrication. Although the selection of different groups has been shown as enabled through the use of switches and MUXs, it should be understood that the selection of algorithms and algorithm options may be hardwired during fabrication of the die, or when the die is integrated into a higher level IC or circuit.

Although only interleaving and averaging algorithms have been explicitly depicted, the enablement of A-to-D pipelining and oversampling with decimation, as well as D-to-A algorithms would be accomplished in a similar manner.

FIG. 9 is a schematic block diagram depicting exemplary A-to-D and D-to-A selections. The data converter die may comprise a plurality of ADCs 900-0 through 900-$n$ and a plurality DACs 902-0 through 902-$m$. In this example, ADCs 900-0 and 900-1 are selected as part of a 2-channel A-to-D algorithm, ADCs 900-2 through 900-5 are selected as part of a 4-channel A-to-D algorithm, and ADC 900-$n$ is unused. DAC 902-0 is selected as part of a 1-channel D-to-A algorithm, and DACs 902-2 and 902-3 are selected as part of a 2-channel D-to-A algorithm. DACs 902-1 and 902-$m$ are unused.

Figure 5:
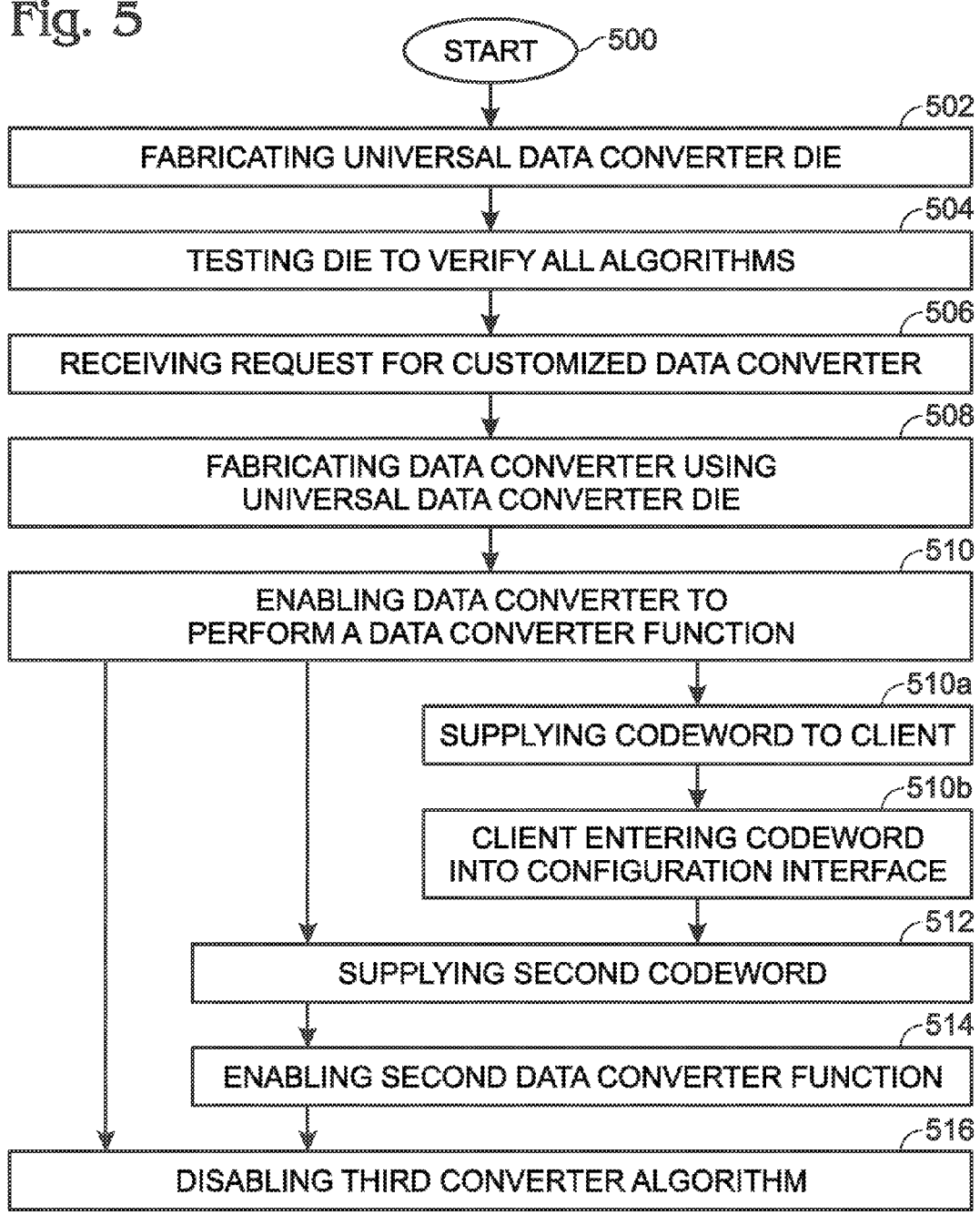
FIG. 5 is a flowchart illustrating a method for supplying a customized data converter fabricated from a universal function die.

FIG. 5 is a flowchart illustrating a method for supplying a customized data converter fabricated from a universal function die. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 500.

Step 502 fabricates a plurality of universal data converter dice. Each universal data converter die is capable of performing a first plurality of data conversion algorithms in response to a corresponding first plurality of codewords. The algorithms may be A-to-D, D-to-A, or both A-to-D and D-to-A. Some exemplary A-to-D data conversion algorithms include averaging, oversampling, multi-stage pipelining, interleaving, and combinations of the above-mentioned algorithms.

Step 504 tests each universal data converter die to verify the performance of the first plurality of data conversion algorithms. Step 506 receives a client request for a customized data converter capable of performing a first data conversion function, selected from among the first plurality of data conversion algorithms. Step 508 fabricates a data converter using a tested universal data converter die. In response to a first codeword, Step 510 enables the data converter to perform the first data converter function.

In one aspect, Step 508 fabricates the data converter with a configuration interface. As noted above, the codeword may be an analog or digital word that is loaded into memory or hardwired when the device is fabricated in Step 508. The codeword may even be considered to be a wire bonding scheme enabled during fabrication of the die or IC. Alternatively, enabling the data converter to perform the first data converter function in Step 510 includes substeps. Step 510$a$ supplies the data converter and the first codeword to the client. In Step 510$b$ the client enters the first codeword into the data converter configuration interface.

In one variation, subsequent to enabling the data converter to perform the first data converter function, Step 512 supplies a second codeword, associated with a second data conversion function, to the client. In response to the second codeword, Step 514 enables the data converter to perform a second data converter function. In one aspect, in response to the first codeword, Step 516 disables the data converter from performing a third data converter algorithm from among the first plurality of data converter algorithms.

As another variation, receiving the request for the customized data converter in Step 506 includes receiving a request for a customized data converter capable of performing a second plurality of data converter functions less than or equal to the first plurality. Then, Step 510 enables the data converter to selectively perform at least one data conversion function from among the second plurality of data conversion functions in response to entering a codeword, from among a second plurality of codewords, into the configuration interface.

In another variation, Step 506 receives a request for a customized data converter capable of performing a first data converter function with a plurality of selectable options. Then, Step 510 enables the data converter to selectively perform a first data conversion option from among the plurality of data conversion options in response to entering a codeword, from among a plurality of option codewords, into the configuration interface.

In another aspect, Step 502 fabricates each universal die with a processor and a non-transitory local memory, and Step 506 receives a request for a customized data converter capable of performing a first data converter function in conjunction with a first data converter software application. Then, Step 508 fabricates the customized data converter with the first data converter application stored as a sequence of processor executable instructions embedded the local memory, and Step 510 enables the processor to access the first data converter application in response to the first codeword. In one variation, Step 506 may receive a request for a customized data converter capable of performing a plurality of data converter functions in conjunction with a corresponding plurality of data converter software applications. Then, Step 508 fabricates the customized data converter with a configuration interface, and Step 510 enables the data converter to perform a task such as loading a software application into the local memory, modifying a software application in the local memory, or a combination of the above-mentioned tasks, in response to supplying a codeword.

Figure 6:
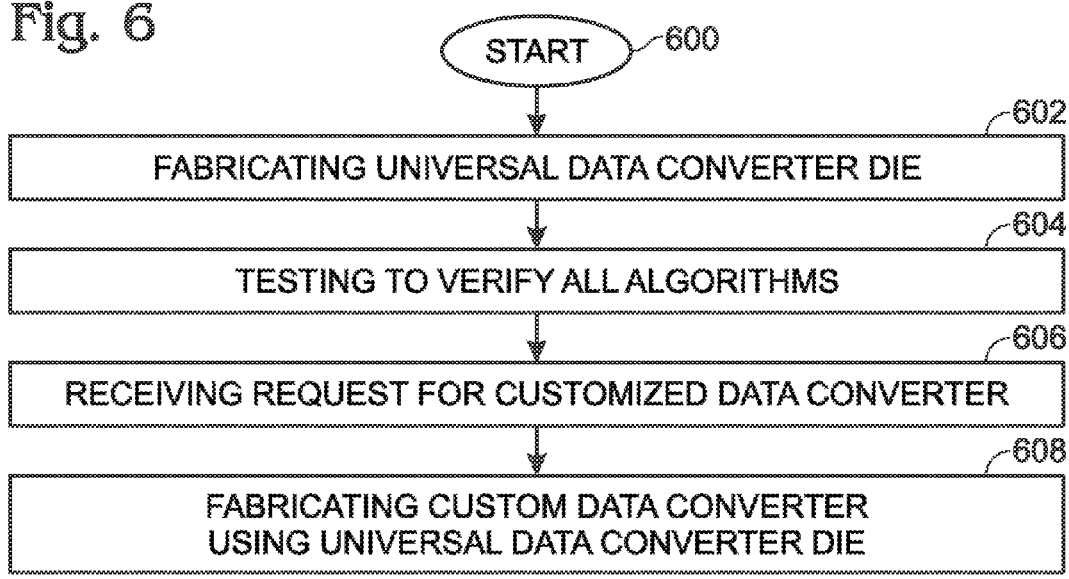
FIG. 6 is a flowchart illustrating another method for supplying a customized data converter fabricated from a universal function die.

FIG. 6 is a flowchart illustrating another method for supplying a customized data converter fabricated from a universal function die. The method begins at Step 600. Step 602 fabricates a plurality of universal data converter dice, each universal data converter die capable of performing a first plurality of data conversion algorithms such as A-to-D, D-to-A, and both A-to-D and D-to-A. Some exemplary A-to-D data conversion algorithms include averaging, oversampling, multi-stage pipelining, interleaving, and combinations of the above-mentioned algorithms. Step 604 tests each universal data converter die to verify the performance of the first plurality of data conversion algorithms. Step 606 receives a request for a customized data converter capable of performing a first data conversion function, selected from among the first plurality of data conversion algorithms. Step 608 fabricates a customized data converter capable of performing the first data conversion function, using a tested universal data converter die. In one aspect, Step 608 grants a client rights to the first data converter function, typically in response to some consideration.

In one aspect, Step 606 receives a request for a customized data converter capable of performing a second plurality of data converter functions, less than or equal to the first plurality, and Step 608 fabricates the customized data converter with a configuration interface to accept signals from an external source, for selecting at least one data conversion function from among the second plurality of data conversion functions. Typically, Step 608 includes fabricating a customized data converter incapable of performing a third plurality of data conversion functions, from among the first plurality of data conversion algorithms.

In another aspect, Step 606 receives a request for a customized data converter capable of performing a first data converter function with a plurality of selectable options. Step 608 fabricates the customized data converter with a configuration interface to accept signals from an external source for selecting the first data converter function options.

For example, Step 606 may receive a request for an A-to-D averaging circuit comprising a plurality of ADCs, where each ADC has an analog input to accept an analog input signal and a digital output to supply a digital output signal with a first signal-to-noise ratio (SNR) in response to sampling the analog input signal. The averaging circuit also comprises an averager having a plurality of inputs, each input connected to a corresponding ADC digital output. The averager has an output to supply an averaged digital output signal with a second SNR, greater than the first SNR. Then, Step 608 fabricates the customized data converter with a configuration interface to accept signals from an external source to select the number of ADCs being sampled.

In another example, Step 606 may receive a request for an A-to-D oversampling circuit. An oversampling circuit comprises an ADC having an analog input to accept an analog input signal having a first signal frequency, a digital output to supply a digital output signal having a first SNR, and a clock input for accepting a first clock signal having a first clock frequency greater than the first signal frequency, where the analog signal is sampled at the first clock frequency. The oversampling circuit also comprises a digital decimation filter having an input to accept the ADC digital output signal, a clock input for accepting a second clock signal having a second clock frequency, greater than or equal to the first signal frequency, and a digital output to supply an oversampled digital output signal having a second SNR, greater than the first SNR. Then, Step 608 fabricates the customized data converter with a configuration interface to accept signals from an external source to select the first clock frequency.

In another example, Step 606 may receive a request for an A-to-D multi-stage pipelining circuit. The pipelining circuit comprises a plurality of stages connected in series, where each stage accepts an analog input signal and supplies a digital output signal in response to sampling the analog signal, and where each non-final stage supplies an amplified analog residue signal to a subsequently connected stage in response to comparing a quantized version of the analog input signal to the analog input signal. A digital summer accepts the digital output signal of each stage, and supply a summed digital signal, wherein the resolution of the summed digital signal is responsive to the number of successively connected stages. Then, Step 608 fabricates the customized data converter with a configuration interface to accept signals from an external source to select the number of stages.

In another example, Step 606 may receive a request for an A-to-D interleaving circuit comprising a clock having a first plurality of clock outputs to supply a first clock signal at a first frequency with a first plurality of clock phases, where each clock output is associated with a unique clock phase. The interleaving circuit also comprises a first plurality of ADCs, each ADC having an input to accept an analog input signal, a clock input to accept a corresponding first clock signal clock phase, and an output to supply a digital output signal at a first data rate in response to sampling the analog input signal at the first frequency. An interleaver has inputs connected to the first plurality of ADC digital outputs, and an output to supply an interleaved digital output signal having a second data rate, greater than the first data rate. Then, Step 608 fabricates the customized data converter with a configuration interface to accept signals from an external source to select the number of phases in the first plurality of clock phases equal to the number of selected ADCs.

Examples of the above-described averaging, oversampling, pipelining, and interleaving circuits are described in detail in U.S. Pat. No. 8,711,026, invented by Mike Kappes, filed Oct. 10, 2013, and issued on Apr. 29, 2014, which is incorporated herein by reference.

In another aspect, Step 602 fabricates each universal die with a processor and a non-transitory local memory, and Step 606 receives a request for a customized data converter capable of performing a first data converter function using a first data converter software application. Then, Step 608 fabricates the customized data converter with the first data converter application stored as a sequence of processor executable instructions embedded the local memory. If Step 606 receives a request for a customized data converter capable of performing a plurality of data converter functions in conjunction with a corresponding plurality of data converter software applications, then Step 608 may fabricate the customized data converter with a configuration interface capable of performing a task such as loading a software application into the local memory, modifying a software application in the local memory, or a combination of the above-mentioned tasks.

Figure 7:
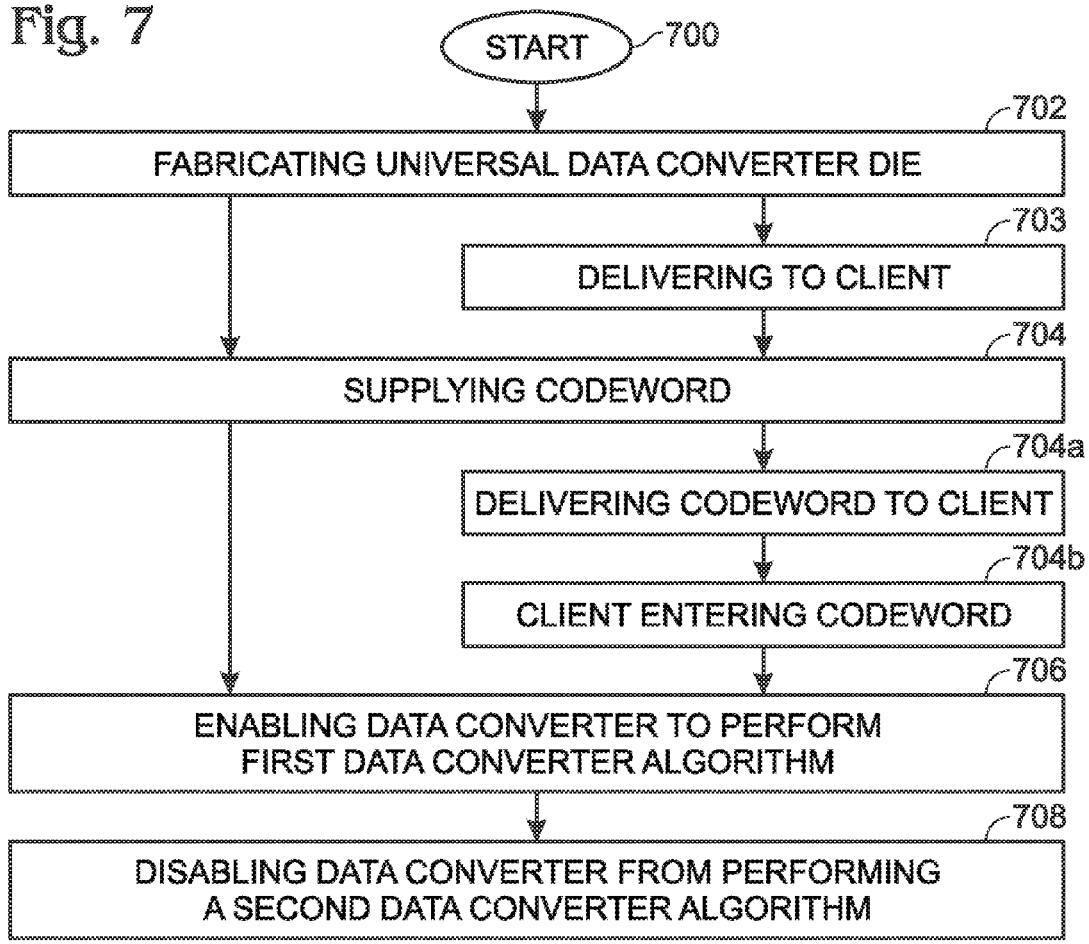
FIG. 7 is a flowchart illustrating a method for distributing customized data converters.

FIG. 7 is a flowchart illustrating a method for distributing customized data converters. The method begins at Step 700. Step 702 fabricates a universal data converter capable of performing a first plurality of data conversion algorithms in response to a corresponding first plurality of codewords, where the algorithms may be A-to-D, D-to-A, and both A-to-D and D-to-A. Step 704 supplies a first codeword. In response to the first codeword, Step 706 enables the data converter to perform a corresponding first data converter algorithm from among the plurality of data converter algorithms. In response to the first codeword, Step 708 disables the data converter from performing a second data converter algorithm from among the first plurality of data converter algorithms.

In one aspect, Step 704 supplies the first codeword as wire bonding instructions for connecting a universal data converter die to a chip carrier in a manner that enables first data converter algorithm circuitry. Alternatively, the first codeword may be a word stored in a non-transitory local memory with instructions for enabling first data converter algorithm circuitry, or the first codeword may be a sequence of processor executable instructions in the local memory for enabling first data converter algorithm circuitry.

In another aspect, Step 702 fabricates the data converter with a configuration interface, and Step 704 supplies the first codeword by entering the first codeword into the configuration interface. In one aspect, Step 704 grants a client the right to use the first codeword. In one aspect, Step 703 delivers the universal data converter to a remote client. Then, entering the first codeword into the configuration interface in Step 704 includes substeps. Step 704a delivers the first codeword to the client, and in Step 704b the client enters the first codeword.

In another aspect, Step 704 supplies a second plurality of codewords corresponding a second plurality data converter algorithms, where the second plurality is less than or equal to the first plurality. Then, Step 706 enables the data converter to perform at least one of the second plurality of data converter algorithms in response to the client entering a codeword selected from among the second plurality of codewords.

Figure 8:
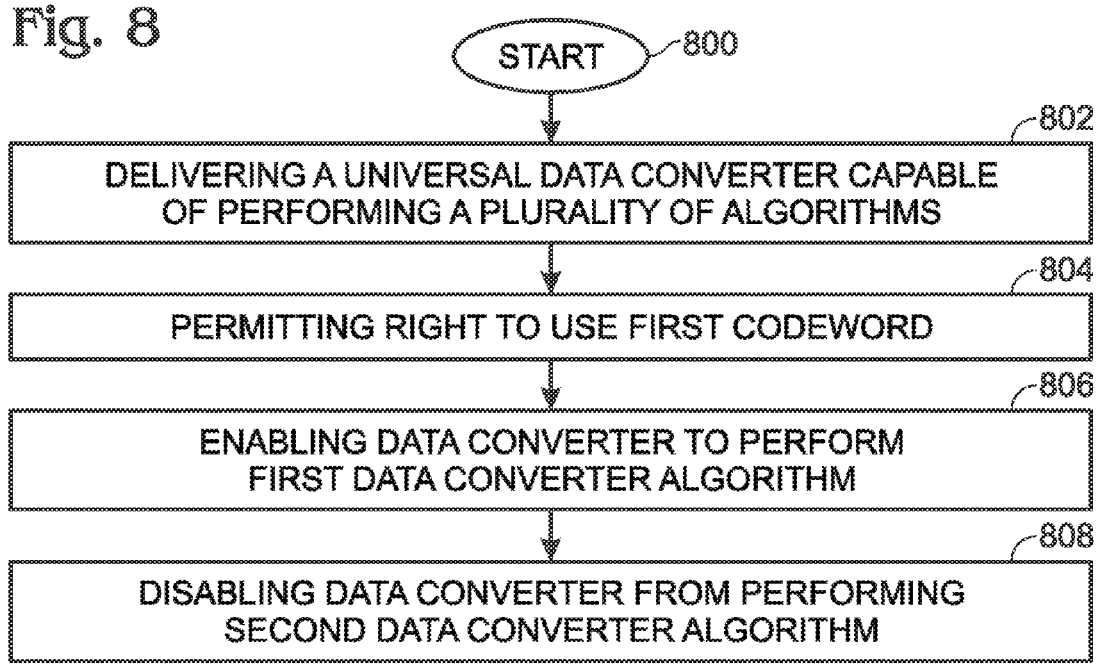
FIG. 8 is a flowchart illustrating a method for enabling the use of a customized data converter algorithm.

FIG. 8 is a flowchart illustrating a method for enabling the use of a customized data converter algorithm. The method begins at Step 800. Step 802 delivers to a client a universal data converter capable of performing a first plurality of data conversion algorithms in response to a corresponding first plurality of codewords, where the algorithms may be A-to-D, D-to-A, or both A-to-D and D-to-A. Step 804 permits the client to have rights to a first codeword corresponding to a first data conversion algorithm. Step 806 enables the delivered data converter to perform a first data converter algorithm. In response to permitting a right to the first codeword, Step 808 disables the data converter from performing a second data converter algorithm from among the first plurality of data converter algorithms.

In one aspect, Step 804 permits rights to the first codeword as a result of forming wire bond connections between a universal data converter die and a chip carrier in a manner that enables first data converter algorithm circuitry. Alternative, Step 804 stores a word in a non-transitory local memory with instructions for enabling first data converter algorithm circuitry, or stores a sequence of processor executable instructions in the local memory for enabling first data converter algorithm circuitry.

In one aspect, Step 802 fabricates the data converter with a configuration interface, and Step 806 enables the data converter to perform the first data converter algorithm as the client entering the first codeword into the configuration interface. In another aspect, Step 804 permits rights to a second plurality of codewords corresponding a second plurality data converter algorithms, where the second plurality is less than or equal to the first plurality. Then, Step 806 enables the data converter to perform at least one data converter algorithm selected from the second plurality of data converter algorithms in response to the client entering a codeword selected from among the second plurality of codewords.

A system and method have been provided for customizing a data converter initially fabricated to potentially perform a plurality of functions. Examples of particular message structures, processors, and hardware units have been presented to illustrate the invention. However, the invention is not limited to merely these examples. While a majority of the examples presented above involved A-to-D algorithms and ADCs, the same principles of operation and use apply to D-to-A algorithms and DACs. Other variations and embodiments of the invention will occur to those skilled in the art.

I claim:

1. A method for supplying customized data converters, the method comprising:
    fabricating a universal data converter having a first plurality of pre-assembled data conversion circuits selectively enabled in response to a corresponding first plurality of codewords, where the data conversion circuits include at least two different members selected from a group consisting of averaging, oversampling, multi-stage pipelining, and interleaving analog-to-digital (A-to-D) algorithms;
    supplying a first codeword; and,
    in response to the first codeword, enabling a corresponding first data converter circuit from among the first plurality of data converter circuits.

2. The method of claim 1 wherein supplying the first codeword includes an operation selected from a group consisting of supplying wire bonding instructions for connecting a universal data converter die to a chip carrier in a manner that enables first data converter algorithm circuitry, storing a word in a non-transitory local memory with instructions for enabling first data converter circuitry, and storing a sequence of processor executable instructions in the local memory for enabling first data converter algorithm circuitry.

3. The method of 1 wherein fabricating the universal data converter includes fabricating the data converter with an enablement interface;
    wherein supplying the first codeword includes entering the first codeword into the enablement interface.

4. The method of claim 3 further comprising:
    delivering the universal data converter to a remote client;
    wherein entering the first codeword into the enablement interface includes:
        delivering the first codeword to the client; and,
        the client entering the first codeword.

5. The method of claim 1 wherein supplying the first codeword includes supplying a second plurality of codewords corresponding to a second plurality pre-assembled data converter circuits, where the second plurality is less than or equal to the first plurality; and, wherein enabling the data converter includes enabling at least one of the second plurality of data converter circuits in response to the client entering a codeword selected from among the second plurality of codewords.

6. The method of claim 1 further comprising:
in response to a first codeword, disabling a second pre-assembled data converter circuit from among the first plurality of data converter circuits.

7. The method of claim 1 wherein supplying the first codeword includes granting a client rights to use the first codeword, enabling the first data converter circuit.

8. The method of claim 1 wherein the first plurality of data converter circuits additionally includes digital-to-analog circuits.

9. A customizable data converter comprising:
a data input interface to receive data in an initial format;
a data output interface to supply data in a converted format; and,
a universal data converter die having a first plurality of pre-assembled data converter circuits including at least two different members selected from a group consisting of averaging, oversampling, multi-stage pipelining, and interleaving analog-to-digital (A-to-D) algorithms, and customized to enable a first data converter circuit from among the first plurality of data converter circuits.

10. The customizable data converter of claim 9 wherein the first plurality of data converter circuits are associated with a corresponding first plurality of codewords; and,
the customizable data converter further comprising;
an enablement interface to accept a codeword for selecting the data converter circuit being enabled.

11. The customizable data converter of claim 9 wherein the first plurality of data converter circuits additionally includes digital-to-analog circuits.

12. A method for su plying a customized data converter, the method comprising:
fabricating a plurality of universal data converter dice, each universal data converter die having a first plurality of pre-assembled data conversion circuits including at least two different members selected from a group consisting of averaging, oversampling, multi-stage pipelin ng, and interleaving analog-to-digital (A-to-D) algorithms;
testing each universal data converter die to verify the performance of the first plurality of data conversion circuits;
receiving a request for a customized data converter with a first data conversion circuit, selected from among the first plurality of data conversion circuits; and,
fabricating a customized data converter with the first data conversion circuit enabled using a tested universal data converter die.

13. The method of claim 12 wherein receiving the request for the customized data converter includes receiving a request for a second plurality of pre-assembled data converter circuits, less than or equal to the first plurality; and,
wherein fabricating the customized data converter includes fabricating the customized data converter with an enablement interface to accept signals from an external source, for selecting at least one data conversion circuit from among the second plurality of data conversion circuits.

14. The method of claim 12 wherein receiving the request for the customized data converter includes receiving a request for a customized data converter having a first data converter circuit with a plurality of selectable options; and,
wherein fabricating the customized data converter includes fabricating the customized data converter with a configuration interface to accept signals from an external source, for selecting the first data converter circuit options.

15. The method of claim 14 wherein receiving the request for the customized data converter having the first data converter circuit with the plurality of options includes receiving a request for an A-to-D averaging circuit comprising:
a plurality of analog-to-digital converters (ADCs), each ADC having an analog input to accept an analog input signal and a digital output to supply a digital output signal with a first signal-to-noise ratio (SNR) in response to sampling the analog input signal;
an averager having a plurality of inputs, each input connected to a corresponding ADC digital output, the averager having an output to supply an averaged digital output signal with a second SNR, greater than the first SNR; and,
wherein fabricating the customized data converter includes fabricating the customized data converter with a configuration interface to accept signals from an external source, for selecting the number of ADCs being sampled.

16. The method of claim 14 wherein receiving the request for the customized data converter having the first data converter circuit with the plurality of options includes receiving a request for an A-to-D oversampling circuit comprising:
an ADC having an analog input to accept an analog input signal having a first signal frequency, a digital output to supply a digital output signal having a first SNR, and a clock input for accepting a first clock signal having a first clock frequency greater than the first signal frequency, where the analog signal is sampled at the first clock frequency;
a digital decimation filter having an input to accept the ADC digital output signal, a clock input for accepting a second clock signal having a second clock frequency, greater than or equal to the first signal frequency, and a digital output to supply an oversampled digital output signal having a second SNR, greater than the first SNR; and,
wherein fabricating the customized data converter includes fabricating the customized data converter with a configuration interface to accept signals from an external source, for selecting the first clock frequency.

17. The method of claim 14 wherein receiving the request for the customized data converter having the first data converter circuit with the plurality of options includes receiving a request for an A-to-D multi-stage pipelining circuit comprising:
a plurality of stages connected in series, where each stage accepts an analog input signal and supplies a digital output signal in response to sampling the analog signal, and where each non-final stage supplies an amplified analog residue signal to a subsequently connected stage in response to comparing a quantized version of the analog input signal to the analog input signal;
a digital summer to accept the digital output signal of each stage, and supply a summed digital signal;
wherein the resolution of the summed digital signal is responsive to the number of successively connected stages; and,
wherein fabricating the customized data converter includes fabricating the customized data converter with a configuration interface to accept signals from an external source, for selecting the number of stages.

18. The method of claim 14 wherein receiving the request for the customized data converter having the first data converter circuit with the plurality of options includes receiving a request for an A-to-D interleaving circuit comprising:

a clock having a first plurality of clock outputs to supply a first clock signal at a first frequency with a first plurality of clock phases, each clock output being associated with a unique clock phase;

a first plurality of ADCs, each ADC having an input to accept an analog input signal, a clock input to accept a corresponding first clock signal clock phase, and an output to supply a digital output signal at a first data rate in response to sampling the analog input signal at the first frequency;

an interleaves having inputs connected to the first plurality of ADC digital outputs, and an output to supply an interleaved digital output signal having a second data rate, greater than the first data rate; and, wherein fabricating the customized data converter includes fabricating the customized data converter with a configuration interface to accept signals from an external source, for selecting a number of phases in the first plurality of clock phases equal to the number of selected ADCs.

19. The method of claim 12 wherein fabricating the plurality of universal data converter dice includes fabricating each universal die with a processor and a non-transitory local memory;

wherein receiving the request for the customized data converter includes receiving a request for a customized data converter having a first data converter circuit using a first data converter software application; and, wherein fabricating the customized data converter includes fabricating the customized data converter with the first data converter application stored as a sequence of processor executable instructions embedded the local memory.

20. The method of claim 19 wherein receiving the request for the customized data converter includes receiving a request for a customized data converter having a plurality of data converter circuits working in conjunction with a corresponding plurality of data converter software applications; and, wherein fabricating the customized data converter includes fabricating the customized data converter with a configuration interface capable of performing a task selected from a group consisting of loading a software application into the local memory, modifying a software application in the local memory, and a combination of the above-mentioned tasks.

21. The method of claim 12 wherein fabricating the customized data converter includes fabricating a customized data converter having a third plurality of non-enabled data conversion circuits, from among the first plurality of data conversion circuits.

22. The method of claim 12 wherein fabricating the customized data converter having the first data conversion circuit includes granting a client rights to use the first data conversion circuit.

23. The method of claim 12 wherein fabricating the universal data converter dice includes fabricating the universal data converter dice with a plurality of digital-to-analog (D-to-A) data conversion circuits selected from a group consisting averaging, oversampling, mixing, and interpolation algorithms.

24. A customizable data converter comprising:

a first data input interface to receive data in an initial format;

a first data output interface to supply data in a converted format;

a processing module to analyze input data received via the first data input interface;

a plurality of data conversion algorithms selected from a group consisting of analog-to-digital (A-to-D), digital-to-analog (D-to-A), and both A-to-D and D-to-A; and wherein the processing module selects a first data conversion algorithm from the plurality of algorithms in response to analyzing the input data received via the first data input interface.

25. The data converter of claim 24 wherein the processing module accesses data for analysis at a node selected from a group consisting of from the first input interface prior to conversion and the first output interface after conversion.

26. The data converter of claim 24 wherein the processing module performs an operation, in response to analyzing the input data, selected from a group consisting of changing from a first A-to-D data converter algorithm to a second A-to-D data converter algorithm, modifying an A-to-D data converter algorithm, changing from a first data input line to a second data input line, changing from the first data output line to a second data output line, changing from an A-to-D data converter algorithm to a D-to-A data converter algorithm, changing from a D-to-A data converter algorithm to an A-to-D data converter algorithm, changing from a first D-to-A data converter algorithm to a second D-to-A data converter algorithm, modifying an D-to-A data converter algorithm, and combinations of the above-listed operations.

27. The data converter of claim 24 wherein the processing module selects a first data conversion algorithm from the plurality of algorithms in response to analyzing a sub-channel message received with the input data.

28. The data converter of claim 27 wherein the first data input interface comprises:

a first input to receive the data to be converted; and, a second input to receive the sub-channel message.

29. A method for supplying customized data converters, the method comprising:

fabricating a universal data converter having a first plurality of pre-assembled data conversion circuits enabled in response to a corresponding first plurality of codewords, where the data conversion circuits include at least two different members selected from a group consisting of averaging, oversampling, mixing, and interpolation digital-to-analog (D-to-A) algorithms;

supplying a first codeword; and, in response to the first codeword, enabling a corresponding first data converter circuit from among the plurality of data converter circuits.

30. The method of claim 29 wherein the first plurality of data converter circuits additionally includes analog-to-digital circuits.

31. A customizable data converter comprising:

a data input interface to receive data in an initial format;

a data output interface to supply data in a converted format; and, a universal data converter die having a first plurality of pre-assembled data converter circuits including at least two different members selected from a group consisting of averaging, oversampling, mixing, and interpolation digital-to-analog (D-to-A) algorithms, and customized to enable a first data converter circuit from among the first plurality of data converter circuits.

32. The method of claim 31 wherein the first plurality of data converter circuits additionally includes analog-to-digital circuits.

33. A method for supplying a customized data converter, the method comprising:

fabricating a plurality of universal data converter dice, each universal data converter having a first plurality of pre-assembled data conversion circuits including at least two different members selected from a group consisting of averaging, oversampling, mixing, and interpolation digital-to-analog (D-to-A) algorithms;

testing each universal data converter die to verify the performance of the first plurality of data conversion circuits;

receiving a request for a customized data converter having a first data conversion circuit, selected from among the first plurality of data conversion circuits; and, fabricating a customized data converter with the first data conversion circuit enabled, using a tested universal data converter die.

34. The method of claim 33 wherein the first plurality of data converter circuits additionally includes analog-to-digital circuits.

35. A method for supplying a customized data converter, the method comprising:

fabricating a plurality of universal data converter dice, each universal data converter die capable of performing a first plurality of data conversion algorithms selected from a group consisting of analog-to-digital (A-to-D), digital-to-analog (D-to-A), and both A-to-D and fl-to-A;

testing each universal data converter die to verify the performance of the first plurality of data conversion algorithms;

receiving a request for an A-to-D averaging circuit function with a plurality of selectable options, the A-to-D averaging circuit comprising:

a plurality of analog-to-digital converters (ADCs), each ADC having an analog input to accept an analog input signal and a digital output to supply a digital output signal with a first signal-to-noise ratio (SNR) in response to sampling the analog input signal;

an averager having a plurality of inputs, each input connected to a corresponding ADC digital output, the averager having an output to supply an averaged digital output signal with a second SNR, greater than the first SNR; and, fabricating a customized data converter with the A-to-D averaging circuit, using a tested universal data converter die, with a configuration interface to accept signals from an external source for selecting the number of ADCs being sampled.

36. A method for supplying a customized data converter, the method comprising:

fabricating a plurality of universal data converter dice with a processor and a non-transitory local memory, each universal data converter die capable of performing a first plurality of data conversion algorithms selected from a group consisting of analog-to-digital (A-to-D), digital-to-analog (D-to-A), and both A-to-D and fl-to-A;

testing each universal data converter die to verify the performance of the first plurality of data conversion algorithms;

receiving a request for a customized data converter capable of performing a first data conversion function using a first data converter software application, selected from among the first plurality of data conversion algorithms; and, fabricating a customized data converter with the first data converter application stored as a sequence of processor executable instructions embedded the local memory, capable of performing the first data conversion function using a tested universal data converter die.

* * * * *